US005734283A

United States Patent [19]
Hedberg

[11] Patent Number: 5,734,283
[45] Date of Patent: Mar. 31, 1998

[54] DEMULTIPLEXOR CIRCUIT

[75] Inventor: Mats Olof Joakim Hedberg, Haninge, Sweden

[73] Assignee: Telelfonaktebolaget LM Ericsson, Stockholm, Sweden

[21] Appl. No.: 477,513

[22] Filed: Jun. 7, 1995

Related U.S. Application Data

[62] Division of Ser. No. 84,619, Jul. 1, 1993, Pat. No. 5,526,361.

[30] Foreign Application Priority Data

Jul. 1, 1992 [SE] Sweden ................................ 9202032

[51] Int. Cl.$^6$ ............................................... H03H 11/26
[52] U.S. Cl. ........................... 327/277; 327/278; 327/285; 327/356; 327/358
[58] Field of Search ............................ 327/269, 270, 327/271, 272, 276, 277, 278, 284, 285, 291, 295, 274, 287, 288, 231, 237–239, 243–247, 252–255, 258, 259, 250, 251

[56] References Cited

U.S. PATENT DOCUMENTS

| | | | |
|---|---|---|---|
| 3,993,957 | 11/1976 | Davenport | 327/119 |
| 3,995,119 | 11/1976 | Pachynski, Jr. | 370/112 |
| 3,995,120 | 11/1976 | Pachynski, Jr. | 370/112 |
| 4,493,095 | 1/1985 | Yazawa | 377/107 |
| 4,713,621 | 12/1987 | Nakamura et al. | 327/152 |
| 4,789,984 | 12/1988 | Swartz | 370/112 |
| 4,791,628 | 12/1988 | Swartz | 370/112 |
| 4,821,297 | 4/1989 | Bergmann et al. | 375/376 |
| 4,926,423 | 5/1990 | Zukowski | 370/112 |
| 4,965,797 | 10/1990 | Yamane et al. | 370/112 |
| 5,081,655 | 1/1992 | Long | 375/373 |
| 5,111,455 | 5/1992 | Negus | 370/112 |
| 5,150,364 | 9/1992 | Negus | 370/112 |
| 5,396,523 | 3/1995 | Hedberg | 375/373 |
| 5,412,697 | 5/1995 | Van Brundt et al. | 327/98 |
| 5,521,499 | 5/1996 | Goldenberg et al. | 327/237 |

FOREIGN PATENT DOCUMENTS

| | | |
|---|---|---|
| 2 199 457 | 7/1988 | United Kingdom. |
| 93/13602 | 7/1993 | WIPO. |

*Primary Examiner*—Timothy P. Callahan
*Assistant Examiner*—Kenneth B. Wells
*Attorney, Agent, or Firm*—Burns, Doane, Swecker & Mathis, L.L.P.

[57] ABSTRACT

A delay line and clock multiplying circuit are disclosed. A plurality of phase shifters impart on a reference clock successively increasing phase shifters, wherein the phase shifters have a plurality of outputs for the successively phase shifted signals. A plurality of first AND gates combine the phase shifted signals in groups to obtain a number of pulses. The pulses are then combined in a plurality of OR gates to obtain a number of pulse signals. A clock signal generator generates, from the pulse signals, mutually time delayed clock signals. A controller is arranged to control the time delay of a delay line circuit. The controller receives at least two mutually phase shifted signals from the outputs of the phase shifters and determines a delay error. The controller then generates a control signal for the delay line circuit, the magnitude of which depends upon the delay error.

12 Claims, 13 Drawing Sheets

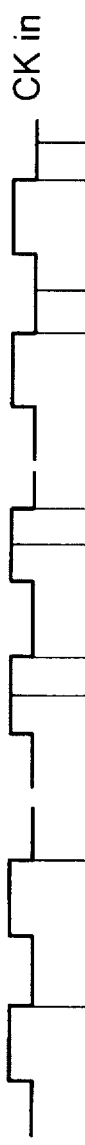
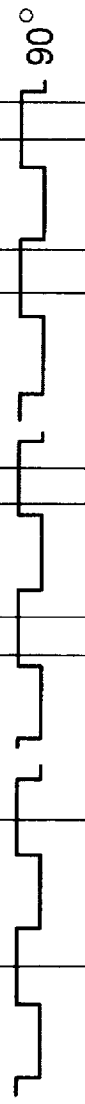
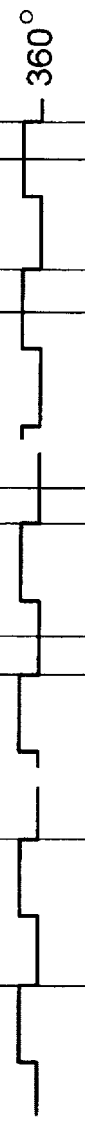
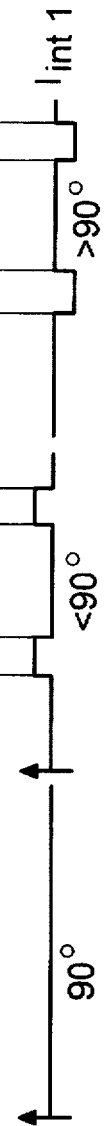
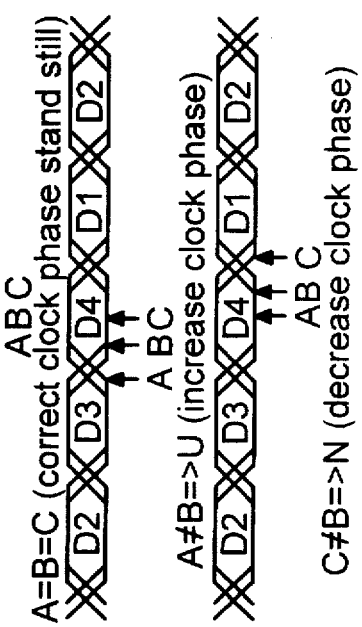
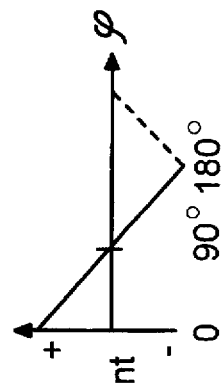

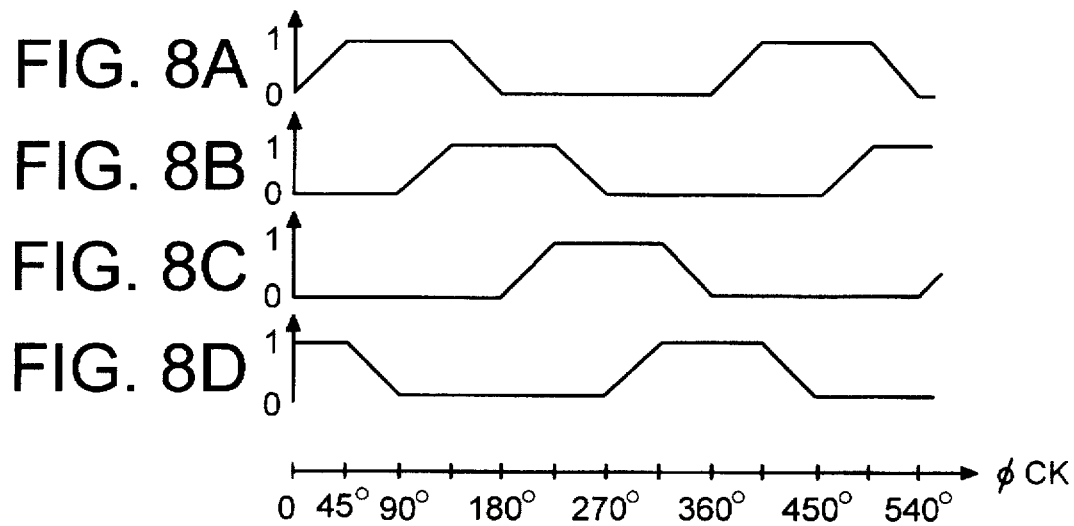
FIG. 8A
FIG. 8B
FIG. 8C
FIG. 8D
FIG. 9
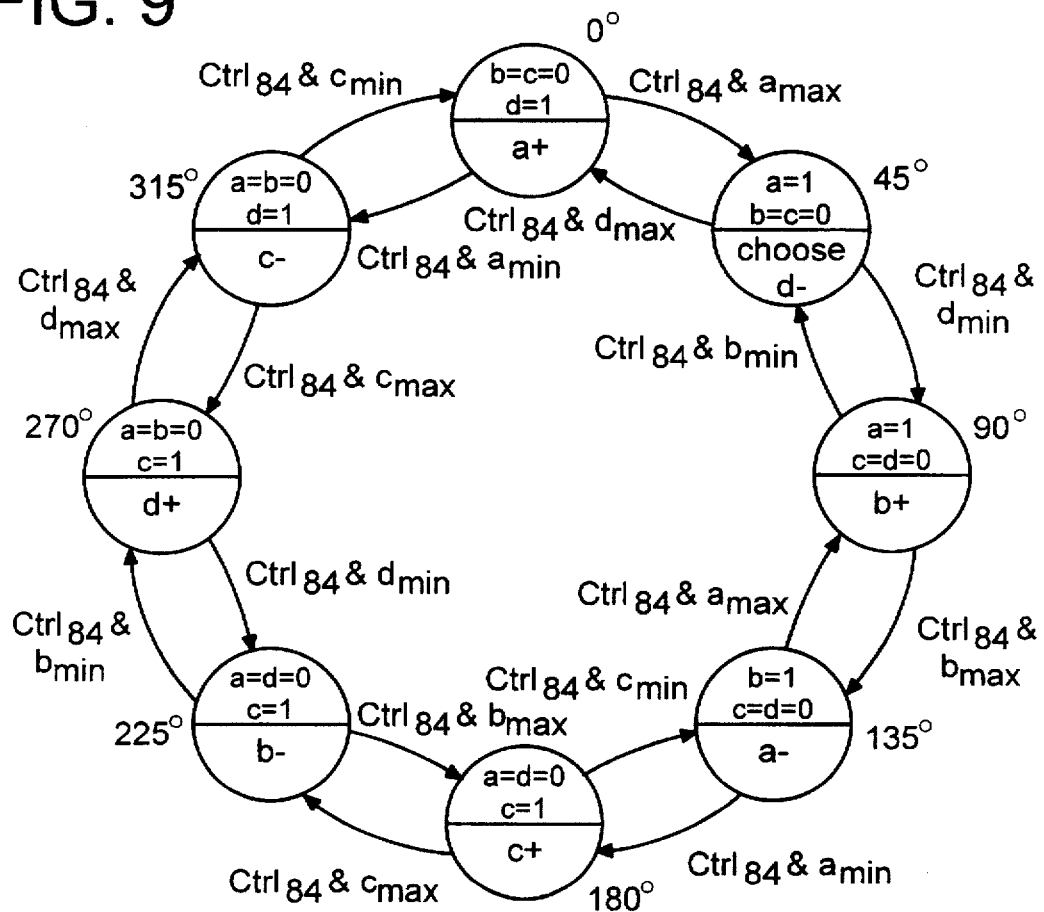

DEMULTIPLEXOR CIRCUIT

This application is a divisional, of application Ser. No. 08/084,619, filed Jul. 1, 1993, now U.S. Pat. No. 5,526,361.

BACKGROUND

The present invention relates to a bit demultiplexor circuit for demultiplexing a serial data stream, and a delay line circuit/clock multiplying circuit, in particular for use in a multiplexor and/or demultiplexor circuit.

Furthermore the invention also relates to a bit multiplexor circuit, including an internal clock generator, which by means of a reference clock generates a number of accurately mutually time delayed clock signals, aligning means arranged to align, by means of one of said clock signals, all incoming parallel data bits with respect to the same clock, delay means for delaying, by means of another one of said clock signals, a number of said data bits, multiplexing means for multiplexing the aligned and delayed data bits by means of said time delayed clocks.

Through International Patent Application PCT/SE92/00809 a method for clock recovery of a digital data signal is known, wherein a number of mutually phase shifted auxiliary clock signals are used to generate a recovered clock signal for the data signal based upon the result of detection of a phase position error, if any, between the data signal and its recovered clock signal. If the phase position error is different from zero and the phase position of the recovered clock signal is between the phase positions of two auxiliary clock signals, these two auxiliary clock signals are mixed for generating an adjusted recovered clock signal with the same phase position as the data signal.

A first object of the invention is to provide a bit demultiplexor of the kind indicated by way of introduction which requires a clock speed for regenerating data, which as a rule is lower than the bit speed of incoming data. Normally the clock speed is the same as that of output data, but shall be able to be changed to different multiples, or parts thereof, both upwardly and downwardly depending on setting or implementation. Also demultiplexing and clock aligning shall be possible to be performed with a low clock speed.

A second object of the invention is to provide a delay line circuit or clock multiplying circuit, which is particularly well suited to be used for example in an internal clock generator of multiplexor and demultiplexor circuits.

A third object of the invention is to provide a bit multiplexor of the kind indicated by way of introduction, which has internal clock generation and only requires a low speed clock for working, e.g. the same speed as that of input data.

The first object of the invention is attained by means of a bit demultiplexing circuit including according to the invention an internal clock generator which by means of a reference clock generates a number of accurately mutually time delayed clock signals, clock aligning means controlled by incoming serial data for providing, by means of the time delayed clock signals a number of differently phased clock signals, the phase positions of which are set in dependence of the phase position of incoming data, first demultiplexing means arranged to clock, by means of said differently phased clock signals, incoming serial data to a parallel data flow, and second demultiplexing means arranged to align, by means of one of the differently phased clock signals, this data flow to outgoing parallel data.

According to a particularly preferred embodiment said clock aligning means include a phase correcting device with selector means for selecting two of the mutually time delayed clock signals, between the phases of which a desired output phase from the phase correcting device is situated, and mixing means for mixing the two selected clock signals for generating a signal with the desired phase, a delay circuit receiving said signal with a desired phase and including means for imparting to it a successively increasing phase shift, and outputs on which such successively phase shifted signals appear as said differently phased clock signals, and control means arranged for providing, by sensing the phase positions of incoming data and of said successively phase shifted signals, a control signal for the generation of said signal with the desired phase by the phase correcting device.

Suitably the control signal to the phase correcting device is obtained via a digital filter.

For attaining the second object a delay line circuit includes, according to a first aspect, phase shifting means for imparting to the reference clock successively increasing phase shift, with a number of outputs for such successively phase shifted signals, first combining means for combining the phase shifted signals in groups for obtaining a number of pulses with a length corresponding to the phase shift between the outputs of the corresponding group and the same frequency as that of the reference signal, second combining means for combining the pulses while maintaining the pulse length for obtaining a number of pulse signals with a frequency consisting of a multiple of the reference clock, a clock signal generating circuit for generating, from said pulse signals, said accurately mutually time delayed clock signals in the form of a desired number of clock signals with a desired mutual phase shift.

The second object of the invention is, however, also attained, in accordance with a second aspect, by means of a clock multiplying circuit, including phase shifting means for imparting to a reference clock successively increasing phase shift, with a number of outputs for such successively phase shifted signals, first combining means for combining the phase shifted signals in groups for obtaining a number of pulses with a length corresponding to the phase shift between the outputs of the corresponding group and the same frequency as that of the reference clock, second combining means for combining the pulses while maintaining the pulse length for obtaining a clock signal with a frequency consisting of a multiple of the reference clock.

In the solutions for attaining the second object the outputs are advantageously combined in pairs.

Furthermore, also very advantageously, the phase shifting means may consist of series connected phase shifting steps, where the input and output of each step are combined for obtaining one of the pulses with a length corresponding to the phase shift of the step.

The first combining means may preferably consist of AND-gates with an inverting input and the second combining means may consist of OR-gates.

According to a very preferred embodiment of the delay line and clock multiplying circuits there is a control circuit, which is arranged to control the time delay of the delay line circuit and includes means connected to receive at least two mutually phase shifted signals from the outputs and sense any delay error, and to generate a control signal for the delay line circuit, the magnitude of which depends upon the error.

Preferably the control circuit includes means for preventing the phase detector from false locking on multiples of the period of the reference clock.

The third object has been attained with a bit multiplexor circuit, of the kind defined by way of introduction, wherein the clock generator includes phase shifting means for imparting to a reference clock successively increasing phase shift, with a number of outputs for such successively phase shifted signals, first combining means for combining the phase shifted signals in groups to obtain a number of clock phases with a length corresponding to the phase shift between the outputs of the corresponding group and with the same frequency as that of the reference clock, second combining means for combining the clock phases while maintaining the pulse length for obtaining an outgoing clock signal with a frequency being a multiple of the reference clock, the outputs of the aligning means and delay means being connected for transferring the aligned and delayed data bits to data inputs of a selector, the selector also having a number of control inputs and a data output, the outputs from the first combining means being connected for transferring the clock phases to the control inputs of the selector, by which the clock phases control the selector so that one data input at a time is connected to the data output of the selector, the outgoing clock signal forming the clock of the outgoing data stream.

According to a very advantageous embodiment of the multiplexor and demultiplexor circuits according to the invention, the internal clock generator may include at least one phase locked delay line circuit with means for clock multiplying, and in the demultiplexor also the delay circuit of the clock aligning means may include at least one phase locked delay line circuit having means for clock multiplying.

DESCRIPTION OF THE DRAWINGS

The invention will now be described more closely below with reference to embodiments shown on the drawings.

In the drawings

FIGS. 2a–2e show prior art signal lapse diagrams of a phase shifting device in FIG. 1 for deriving 90° phase shifted auxiliary clock signals, FIG. 3a shows diagrams illustrating a signal sequence in a portion of the circuit according to FIG. 3, FIGS. 8a–8d show diagrams illustrating control signals derived in the phase variation device for enabling continuous variation of the phase of recovered clock signal, FIG. 9 is a state graph illustrating the way of operation of the phase variation device.

DETAILED DESCRIPTION

Figure 1A:
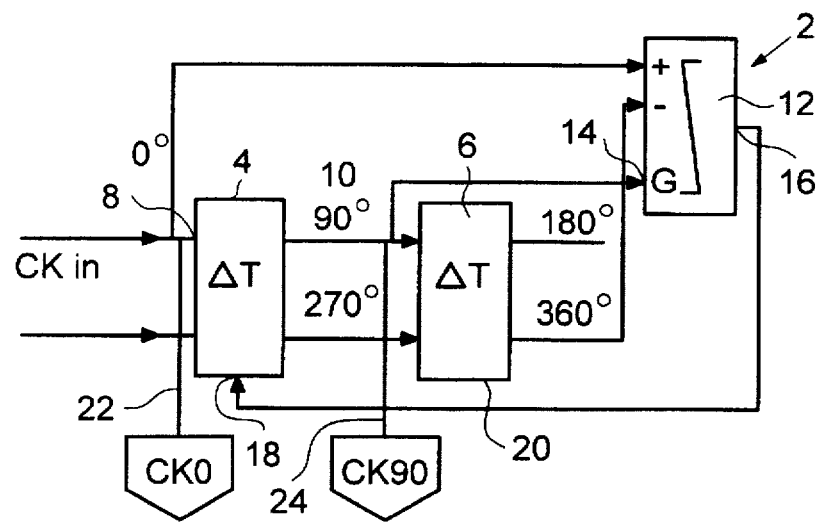
FIGS. 1(a)–(b) show a schematic block diagram of a prior art multiplexor circuit.

The prior art multiplexor circuit shown in FIG. 1(a) includes on its input a circuit, generally designated 2, which from a reference clock signal $CK_{in}$ derives a number of mutually accurately phase shifted auxiliary clock signals. The circuit 2 includes two phase delay and differential steps 4 and 6 consisting of differential amplifiers, the speed and band width of which may be controlled by means of an external reference current generated in a way described below.

The delay step 4 on an input 8 receives the clock signal $CK_{in}$ and delays it 90°, and emits this 90° signal and its antiphase signal, i.e. a signal phase shifted 270° with respect to the incoming clock signal $CK_{in}$, on a respective output. The 90° phase delayed signal is fed to an input 10 of the delay step 6 which in turn shifts the phase thereof further by 90°, i e. to 180° with respect to the incoming clock signal, and emits this signal and its 360° antiphase signal on a respective output.

In FIG. 1 and further below the four thus obtained phase delayed signals are indicated with their respective phase delay values with respect to the clock signal $CK_{in}$.

The clock signal $CK_{in}$ and the 360° signal are fed to a +input and a –input, respectively, of an integrator 12, the bandwidth of which is so low that the output current may be regarded as a direct current. The integrator 12 has an extra gate input 14 for making the integrator active only when a positive signal is received on this input. The 90° signal is fed to the gate input 14 of the integrator. Thereby the integrator 12 is arranged to generate the above mentioned external reference signal for the delay steps 4 and 6 and emits the same on an output 16 which is fed back to respective control inputs 18 and 20 of the two delay steps 4 and 6 and thereby by means of said reference signal controls the latter so that they are set to 90° phase delay.

FIGS. 2a–2d show the clock signal $CK_{in}$, the 90° signal, the 360° signal and the output signal $I_{int1}$ of the integrator 12 above each other for three different cases following each other in the horizontal direction. These are phase shifted with exactly 90°, less than 90° and more than 90°, respectively, of the delay steps. The latter two cases involve, as appears from a comparison of FIG. 2a and 2c, a corresponding phase shift between the clock signal $CK_{in}$ and the 360° signal, and provides rise to positive and negative current pulses from the integrator 12 with a width corresponding to the phase shift, as appears from FIG. 2d. FIG. 2e shows the mean current $\bar{I}_{int1}$ as a function of the phase shift or angular error φ over a delay step. The output current of the integrator is thus zero at 90° phase shift.

The design and operation of the delay steps 4 and 6 designed as differential amplifiers according to the above, as well as of the integrator 12 should be evident to one skilled in the art and need therefore not be described more closely below.

Figure 1B:
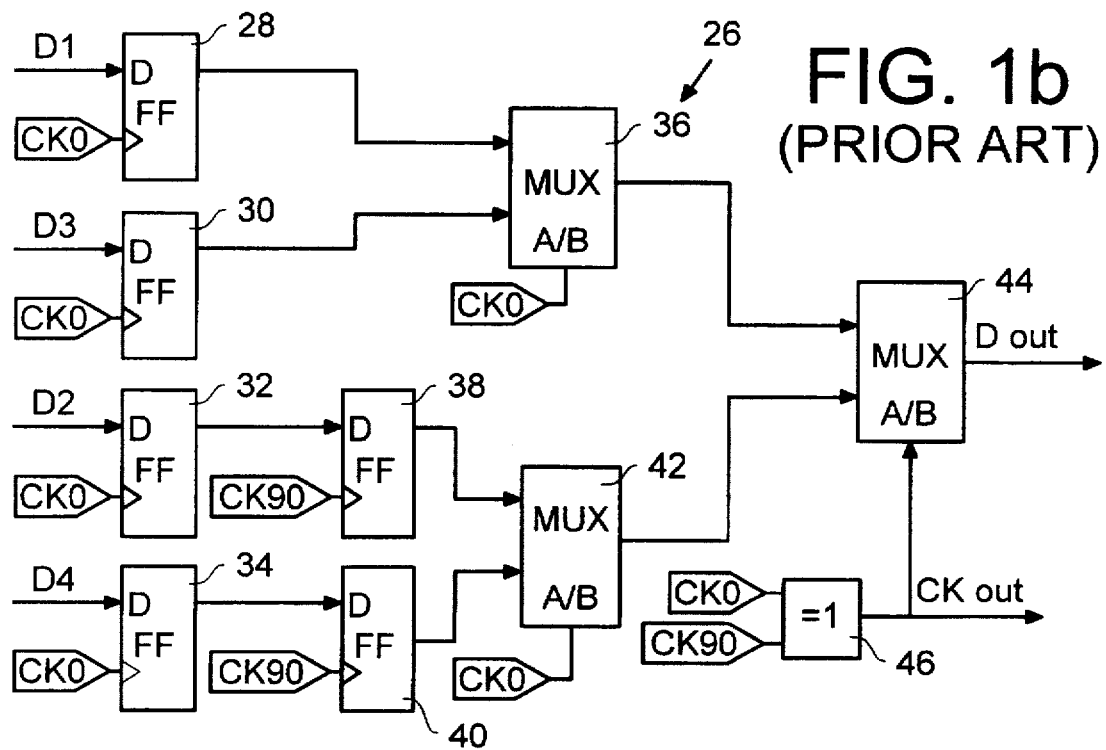

From the circuit 2 the 0° signal and 90° signal are tapped at 22 and 24, respectively and are supplied to the rest of the multiplexor circuit described below. The multiplexor circuit proper in FIG. 1(b) is generally designated 26. It includes on its input MS-flip-flops 28, 30, 32, 34 arranged in parallel. The outputs of the flip-flops 28 and 30 are connected to a multiplexor stage 36. The outputs of the flip-flops 32 and 34 are connected to the D-inputs of respective further MS-flip-flops 38 and 40. The outputs of the flip-flops 38 and 40 are connected to a multiplexor stage 42. The output of the multiplexor stages 36 and 42 are connected to a further multiplexor stage 44.

The clock inputs of the flip-flops 28, 30, 32, 34 and of the multiplexor stage 36 are connected for receiving the 0° signal from the output 22 of the circuit 2. The clock inputs of the flip-flops 38 and 40 as well as of the multiplexor stage 42 are connected for receiving the 90° signal from the output 24 of the circuit 2. Furthermore, the clock input of the multiplexor stage 44 is connected to the output of an exclusive OR-gate 46, the two inputs of which are connected for receiving the 0° signal and 90° signal, respectively, from the circuit 2.

The described multiplexor circuit 26 only requires a low speed clock, the same clock speed as for input data, for being able to work.

For generating the necessary different clock phases the circuit 2 is used, which provides accurate time delays. The obtained multi-phase clock is used for driving the multiplexing circuits.

At first all data bits D1, D3, D2 and D4 are entered with the 0° clock signal into the respective data inputs of flip-flops 28, 30, 32 and 34. Thereby all incoming data will be aligned with respect to the correct clock. The data bits D2 and D4 are delayed 90° by means of the flip-flops 38 and 40, respectively. Thereafter multiplexing in pairs of D1 and D3, on the one hand, and of D2 and D4, on the other hand, is carried through by means of the respective 0° and 90° clock signals in the multiplexor stages 36 and 42, respectively. In the last multiplexor stage 44, the two data streams are multiplexed together by means of the composite clock which has been received from the gate 46 and has half the bit-frequency.

The clock $CK_{out}$ received from the gate 46 together with data $D_{out}$ from the output of the multiplexor stage 44 thus only has half the bit-frequency. This is part of a principle of not having a higher speed anywhere than maximum data speed. The great advantage of this solution is that it does not require any external clock with the high frequency otherwise needed for being able to operate.

Other multiplexing quotients than the one appearing from the description above are conceivable.

Figure 3:
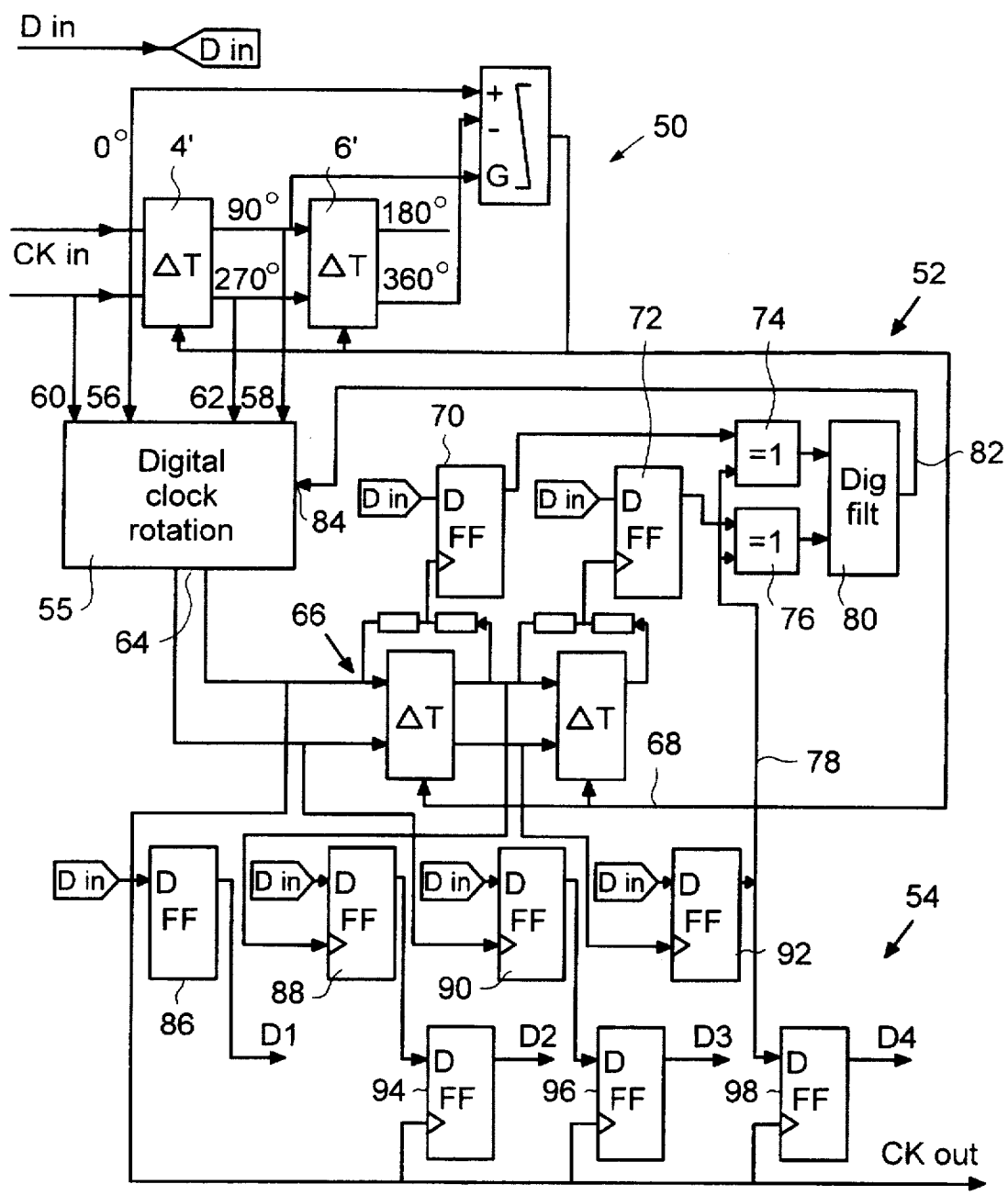
FIG. 3 shows a schematic block diagram of a first embodiment of a demultiplexor circuit according to the invention.

The demultiplexing circuit shown in FIG. 3 includes an input delay circuit 50 exactly corresponding to the delay circuit 2 of FIG. 1. Furthermore it includes a clock aligning circuit 52 and a demultiplexor proper 54, which will be described more closely below.

The clock aligning circuit 52 includes a phase variation circuit 55, also called "clock rotator" and described more closely below. In short this clock rotator receives the 0°, 90°, 180° and 270° output signals on inputs 56, 58, 60 and 62, respectively. The outputs 64 of the clock rotator 55 are connected to a delay circuit 66 of the same type as the delay circuit 50. The reference current controlling the delay of the delay circuit 66, has the same source as in the case of the delay circuit 50, i.e. the integrator included in the latter, from which the reference current is supplied to the circuit 66 via a connection 68.

From the first stage of the delay circuit 66 the 0° and 90° signals are taken and mixed through resistors R and supplied to the clock input of a MS-flip-flop 70, i.e. an edge trigged D-flip-flop. To the of the flip-flop 70 incoming data $D_{in}$ are supplied. From the second stage of the delay circuit 66 the 90° and 180° signals are extracted and mixed through resistors R and supplied to a further MS-flip-flop 72, to the D-input of which incoming data $D_{in}$ are likewise supplied. The outputs from the flip-flops 70 and 72 are each connected to one input of exclusive OR-gates 74 and 76, respectively, the other inputs of which are connected, in a way to be described more closely below, to the demultiplexor 54 via a connection 78. The outputs of gates 74 and 76 are connected to the inputs of a digital filter 80, the output 82 of which is connected to a control input 84 of the clock rotator 54.

The demultiplexor 54 includes seven MS-flip-flops 86, 88, 90, 92, 94, 96 and 98, respectively. The flip-flops 86, 88, 90 and 92 receive incoming data on the respective D-inputs and their clock inputs are connected for receiving the 0° signal, 90° signal, 180° signal and 270° signal from the delay circuit 66. The outputs of flip-flops 88, 90 and 92 are connected to the D-inputs of flip-flops 94, 96 and 98, respectively, the clock inputs of flip-flops 94, 96 and 98 being connected for receiving the 0° signal from the delay circuit 66. The output of flip-flop 92 is also, via the connection 78, connected to the above-mentioned second input of gates 74 and 76. Thus, this implies that these gates 74, 76 on their respective second inputs receive the data clocked out with the 270° signal in the flip-flop 92.

The circuit consisting of elements 70–80 forms a digital phase detector, the way of operation of which will be described below in short with reference to FIG. 3a which illustrates signals appearing in the circuit.

The output signals of D-flip-flops 70 and 72 are associated with A and C, respectively in FIG. 3a, whereas the output signal from the flip-flop 92 is associated with B. By carrying through these three readings and comparing them it is possible to see how the reading points are located in the "data eye". If the reading occurs too early, A will deviate from B, which results in the gate 74 emitting a signal implying that the clock phase should be increased. Correspondingly C will deviate at late reading resulting in the gate 76 emitting a signal implying that the clock phase should be decreased.

As to their nature, the mentioned signals are digital and do not contain any information about the magnitude of the deviation. Therefore it is suitable to make some form of digital filtering or, in other words, some form of statistic judgement of the received information before decision is taken to change phase. Said digital filtering is obtained by means of the filter 82. It would also be conceivable with a simpler analogue filtering, which however could make it more difficult to affect the characteristics of the adjustment.

By means of elements 64–84 the clock aligning circuit 52 forms a phase locked loop controlled by incoming data $D_{in}$, which are clocked by flip-flops 70, 72 and 92 by means of the incoming two-phase clock from the two stages of the delay circuit 66. By controlling the proportion and sign of the two incoming signals it is possible to mix together a clock with an arbitrary phase in the clock rotator 55. By controlling the mixing continuously it is possible to shift the phase of the output signal unlimitedly forward or backward and thereby adjust the clock appearing after incoming data also if it slides away with time, without losing information. The denomination digital clock aligning circuit is due to the control of the clock rotation or clock shift since the digital filter is made in discrete stages for being able to stand still when in-data lacks information regarding the phase position, i.e. longer sequences of ones or zeros. It is well conceivable to make this analog function but this would require external decoupling of parasitic capacitances at 84 or in the proceeding circuits, depending for example upon the nature of incoming data.

By the output signal from the clock rotator 55 being connected to the delay circuit 66 of the same type as the delay circuit 50 and controlled by the same reference currents, the multiphase clocks needed for the demultiplexor circuit 54 are generated.

The clock aligning circuit 52 attends to making the phase of the clocks to be positioned correctly, and the circuit 50 controls that the clocks have a correct mutual distance.

The demultiplexing in the demultiplexor 54 is thus carried through by the four first flip-flops 86–92 by means of the respective multiphase clock clocking incoming data. The flip-flop 86 and the three last flip-flops 94–98 by means of the 0° signal align the outgoing data D1, D2, D3 and D4, respectively.

Figure 4:
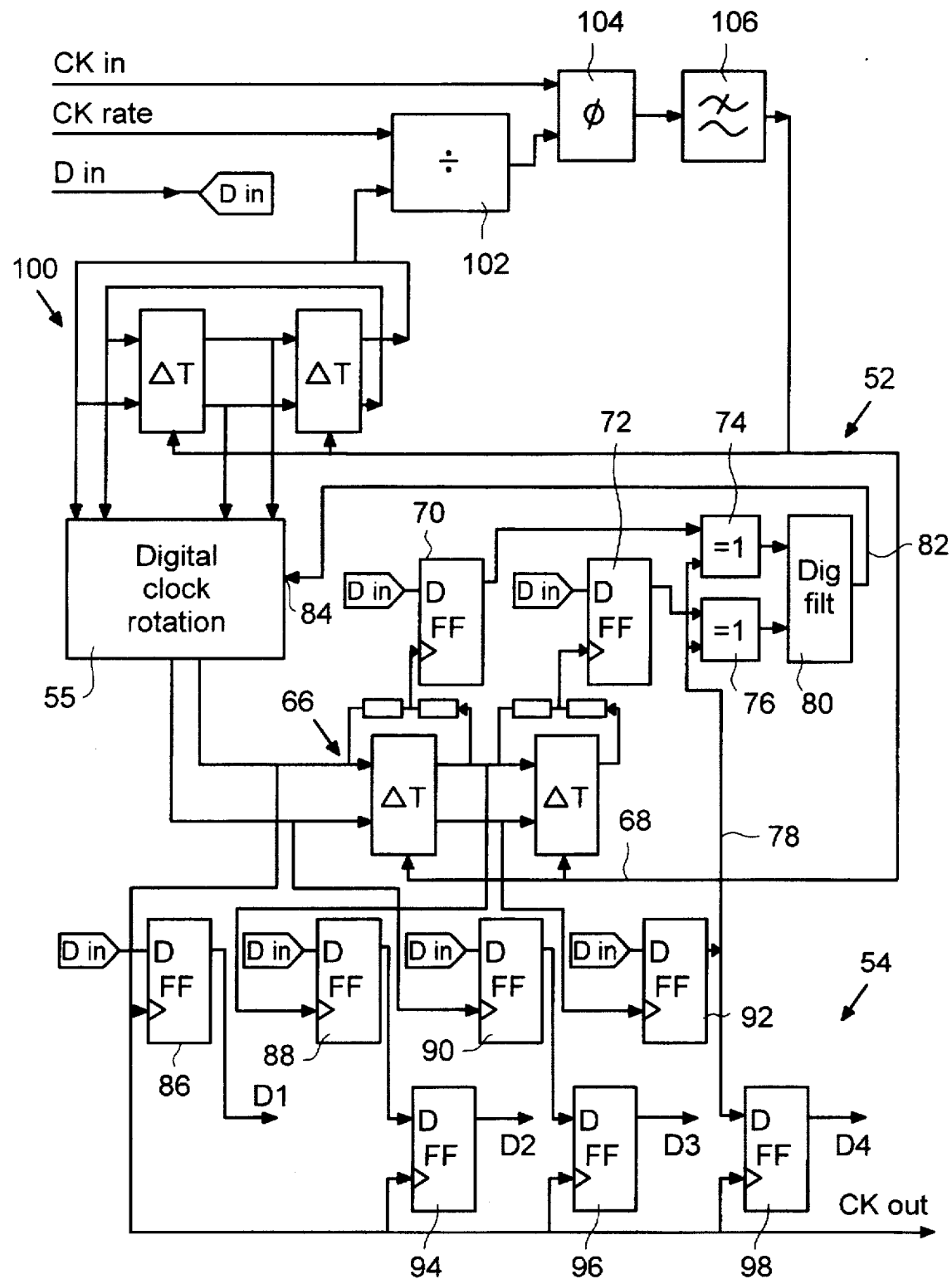
FIG. 4 is a schematic block diagram of a second embodiment of a demultiplexor circuit according to the invention.

The demultiplexing circuit according to FIG. 4 differs from the one in FIG. 3 by the delay circuit 50 of the latter being replaced by an analogous PLL-circuit. This PLL consists of a free wheeling current controlled oscillator 100 controlled by the input signal via a feed-back loop. The feed-back loop includes a divider 102 receiving a signal CKrate, which determines the dividing factor of the divider. The output of the divider 102 is connected to one input of a phase detector 104, which on a second input receives $CK_{in}$. Finally a low pass filter 106 is located after the phase detector 104. This feed-back loop makes it possible to multiply the output clock further.

The design and function of the phase varying circuit will now be described more closely below with reference to FIGS. 3 and 5–9. The 90°, 180°, 270° and 360° output signals derived from the delay steps 4' and 6' are fed to respective switching elements 138, 140, 142, and 144, included in the phase varying circuit 55. The switching elements 138–144 can consist of some form of controllable impedances, e.g. FET resistances or MOS transistors. The recovered clock signal $CK_{out}$ is obtained, in a way to be described more closely below, on the outputs of the switching elements 138–144, said outputs being connected in parallel to the output 64 of the circuit 55.

The control input 84 receiving the above-mentioned current signal from the output of the digital filter 182 forms the input of an analog selector circuit 146 which, via outputs 148, 150, 152, 154, controls the let through of the respective switching elements 138, 140, 142 and 144, of their respective phase shifted signal.

Figure 5:
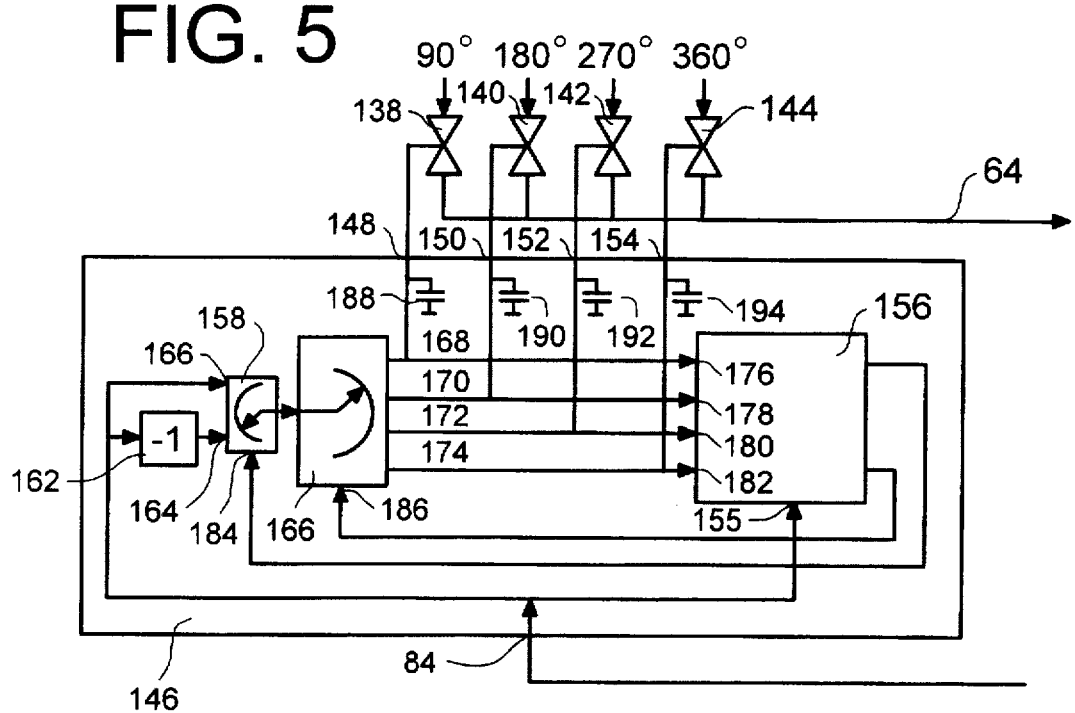
FIG. 5 shows a diagram of one embodiment of a phase variation circuit included in the circuits according to FIGS. 3 and 4, FIGS. 6 and 7 show portions of the diagram according to FIG. 5 more in detail.

An embodiment of the selector circuit 146 is shown in detail in FIG. 5. The current signal to the selector circuit 146 is led, on the one hand, to an input 155 of a logic control network 156 to be described more closely below, which contains digital logic, and, on the other hand, to an analog switch 158 receiving the current signal on an input 160 and, via an inverting amplifier 162, its inverted value on an input 164. The switch 158 has an output connected to an analog selector 166 with four outputs 168, 170, 172, and 174 connected to each one of the respective outputs 148, 150, 152 and 154 of the selector circuit 146, and to each one of four inputs 176, 178, 180 and 182, respectively, of the logic control network 156. The latter has two outputs connected to a control input 184 of the analog switch 158 and, respectively, to a control input 186 of the analog selector 166.

The capacitances designated 188, 190, 192 and 194 in FIG. 5 of the outputs 148–154 represent parasitic capacitances and extra capacitance, if any.

Figure 6:
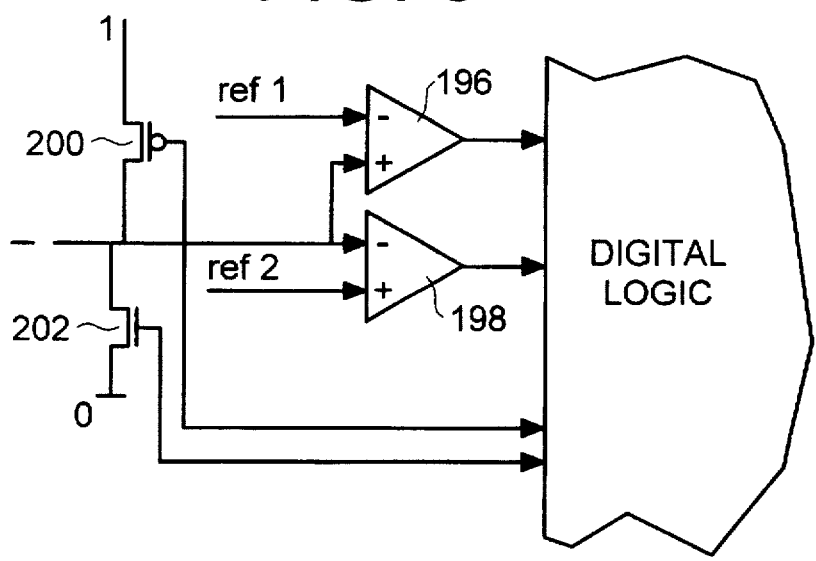

The design of each of the inputs 176, 178, 180, 182 appears more closely from FIG. 6. Between each input and the digital logic there are two comparators 196 and 198 arranged in parallel. The comparator 196 on its +input receives a control voltage derived in a way to be disclosed more closely below from the current signal, and on its −input a set first reference value ref1, and provides maximum output signal if said control voltage exceeds this reference value. The comparator 198 in the same way receives on its −input a control voltage derived in a way to be disclosed more closely below from the current signal and on its +input a set second reference value ref2, and provides minimum output signal if this control voltage is lower than this reference value. By means of the above described function of the two comparators 196 and 198 a detection is carried through with respect to when the outputs from the selector 166 are fully set to minimum or maximum value, as will be likewise described more closely below.

Each of the inputs 176–182 furthermore includes two schematically indicated holding functions in the form of MOS transistors 200 and 202 of n and p type, respectively, connected as shown, which are controlled by signals from the digital logic for holding the corresponding output of the selector 166 when it has such a phase position that it shall keep a fixed level 0 or 1 (FIG. 8), said levels being defined more closely below.

Figure 7:
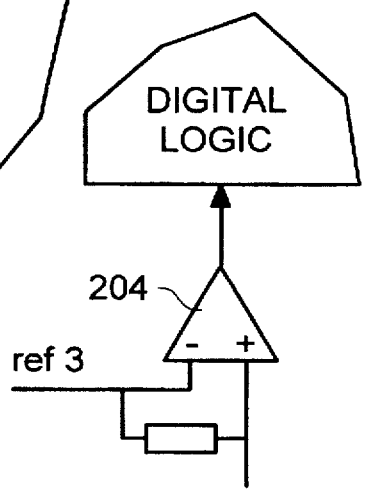

With reference to FIG. 7 the input 155 of the logic control network 156 is connected to the digital logic included therein via a comparator 204, more particularly its +input. Comparison with a reference value ref3 on the −input of the comparator is carried through for detecting whether the control signal at 84 and 155 has a positive or negative sign. The comparator inputs are shown connected to a resistor R. This arrangement provides a detection of whether the output signal at 64 precedes or lags, and enables the digital logic to change the phase in the correct direction.

The digital logic of the logic control network 156 provides for the control signal at 84, in accordance with that which will be described more closely below, to be periodically connected to the outputs 168, 170, 172 and/or 174 in accordance with a predetermined scheme by means of the analog selector 166, and so that it becomes the correct sign by means of the analog switch 158. The current signal charges the respective capacitances 188, 190, 192 or 194, the resulting charging voltage of which being applied to the control electrode of the respective switching elements 138, 140, 142 or 144.

The scheme mentioned above is illustrated most simply by means of the diagrams of FIGS. 8a-8d. These diagrams illustrate the charging voltages $u_a$, $u_b$, $u_c$, $u_d$ of the capacitances 188-194, the degree signs on the lower horizontal common axis representing the phase shift between $CK_{out}$ and $CK_{ur}$. The levels 0 and 1 in the diagrams mean that the respective signal is completely disconnected or completely connected into circuit, respectively, which is obtained by means of the arrangements described above with reference to FIG. 6. The ramps represent charge and discharge of the respective capacitances 188-194, which enables a continuous control of the switching elements 138-144 and thereby of the phase of the recovered clock signal $CK_{out}$. More particularly, this is attained by such a design of the digital logic that its function can be described by the state graph shown in FIG. 9.

In the state graph according to FIG. 9
- the state rings represent the successively varying states of the switching elements 138, 140, 142 and 144, the degree sign at the respective ring indicating the starting point for the state according to this ring as seen along the horizontal axis in FIG. 8,
- the letters a–d represent the respective diagrams a–d in FIG. 8, "=0" and "=1" in association with the letter indicating the state 0 and 1, respectively, of the respective voltage $u_a$–$u_d$, "+" or "−" in association with the letter indicating a state on the positive and negative edge, respectively, of the respective diagram, and "max" or "min" in association with the letter indicating the end of a positive or a negative edge, respectively,
- +Ctrl$_{84}$ and −Ctrl$_{84}$ represent information as to whether the sign of the control signal at 84 is + or −, respectively.

In the ring at 0° in the state graph b=c=0, d=1 indicates that the digital logic of the logic control network 156 by the holding functions 102, 200 and 202 holds the inputs 178 and 180 on the fixed level 0, and the input 182 on the fixed level 1. Regarding "a+", "a" indicates that the logic controls the selector 166 to keep the output 168 open, and "+" means that the switch 158, by the logic detecting the sign of Ctrl$_{84}$ at the input 155 (FIG. 6), is controlled to keep its input 160 open, i.e. Ctrl$_{84}$ is let through non-inverted by the selector.

As a result the switching element 144 is kept completely open for the 360° signal, and the capacitance 188 is charged by the current from the output 168 so that the switching element 148 successively opens for the 90° signal. A mixing of the two mentioned signals on the common output from the switching elements is obtained, and results in the phase of the resulting signal ($CK_{out}$) successively increasing from 0° as the amplitude of the 90° signal increases. This corresponds to moving upwardly along the positive edge of the curve a in FIG. 8.

If the control signal at 84 stops turning up the logic stops, and the charging of the capacitance 188 stops. On one hand, this results in the switching element 144 henceforth being kept open due to the fact that the state on the logic input 182 is kept fixed, and on the other hand, that the capacitance 188 keeps its attained charge, and its voltage maintains the attained open state of the switch element 138. The input signal at 64 has been brought into phase with $D_{in}$.

However, if Ctrl$_{84}$ continues to come with a positive sign a state is attained at last where both of the switching elements 138 and 144 are completely open, which implies that the phase of the output signal at 64 has moved halfway between 0° and 90°, i.e. 45°. The logic now via the respective comparator pair 196, 198 (FIGS. 5, 6) senses that its inputs 176 have exceeded the reference value refl, and via its input 155 (FIG. 7) that the control signal continues to have a positive sign. This state, which is characterized by the state change arrow "+Ctrl$_{84}$ & $a_{max}$" pointing clockwise from the upper state circle in FIG. 9, brings the logic to keep the attained state on the input 176, change over the control signal to the input 164 of the switch 158, and to open the output 174 for discharging the capacitance 174 by the changed current flow direction, cf. also "d−" in the 45° circle of FIG. 9. The state defined by the 45° −circle of the state graph has now been attained. The resulting decrease of the amplitude of the 360° signal results in the phase of the signal at 64 being continuously changed (along the negative edge of d in FIG. 8) toward 90° which is attained when the capacitance 194 is entirely decharged, if the control signal at 84 does not become zero before that, in which case the phase of the signal at 64 stops on a value between 45° and 90°.

The state "+Ctrl$_{84}$ & $d_{min}$" defined in association with the clockwise directed state change arrow between the 45° and 90° state circles has now been attained and is sensed by the logic as implying that the inputs 178, 180 and 182 take the same state. If the sign of the control signal at 84 furthermore continues to be positive, the logic is now set to open the input 160 of the switch 158 and the output 170 of the selector 166 for Ctrl$_{84}$ with positive sign, that charges the capacitance 190, following the positive edge of curve b in FIG. 8, cf. also "b+" in the 90° circle in FIG. 9.

As long as the control signal at 84 is different from zero the logic continuously works through the state graph according to FIG. 9 for continuous change of the phase of the output signal at 64, in the same way as has been described above. The direction is determined by the sign of Ctrl$_{84}$, i.e. it is counter clockwise in the graph at negative Ctrl$_{84}$, following the inner state change arrows.

If Ctrl$_{84}$ is small, i.e. if a small phase error appears, a relatively slow recharge is obtained at the respective output 148-154, whereby a relatively slow phase change is obtained via the controllable impedances 138-144. The result becomes, however, a slow movement around according to FIGS. 8 and 9, and thereby a continuous phase change.

A greater control signal at 84 results in a faster recharge of the capacitances at the outputs from the analog selector 166 and thereby a faster phase change.

The magnitude of the capacitances 188-194 also affects the speed such as with increasing magnitude the process becomes slower.

Figures 10, 11:
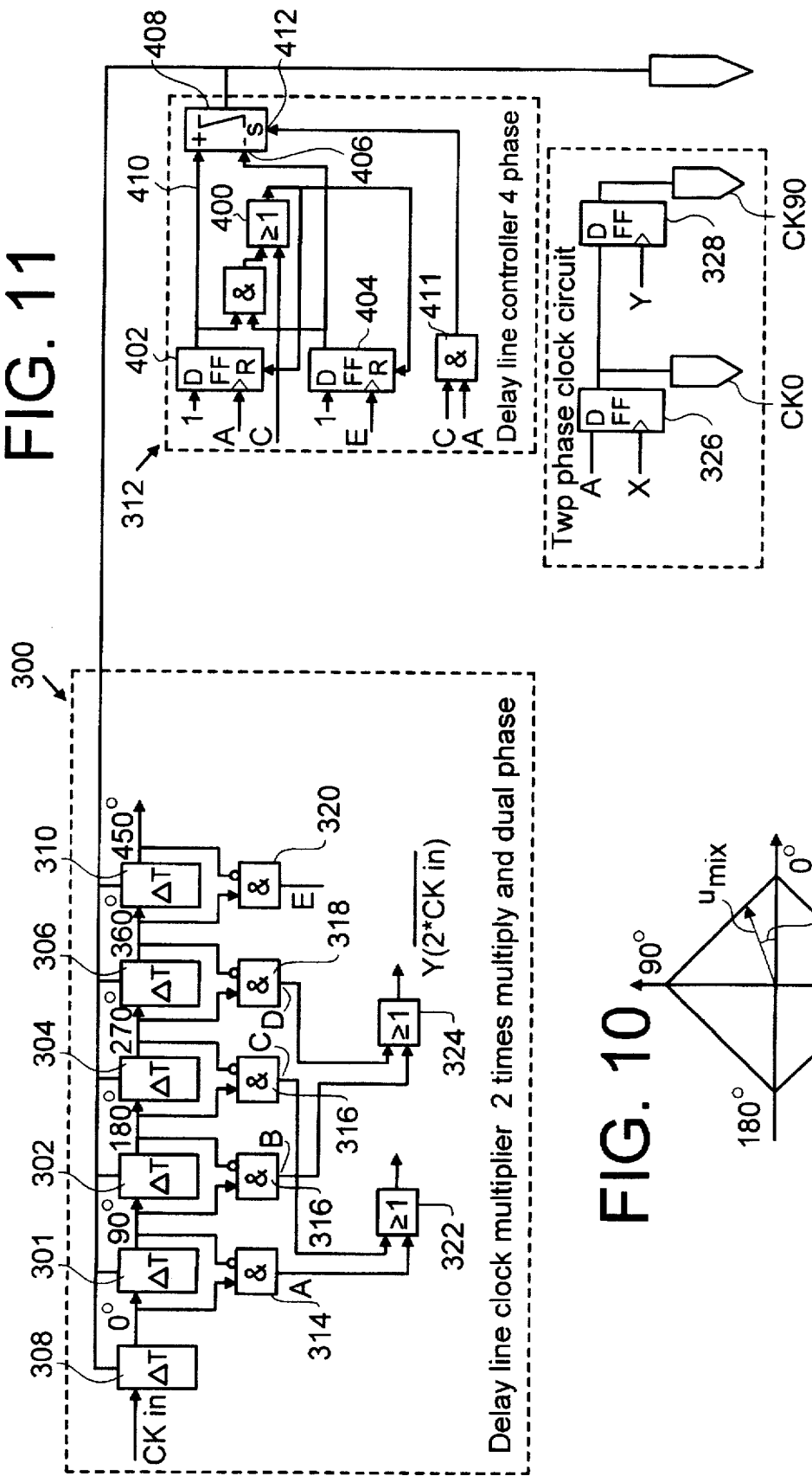
FIG. 10 is a vector diagram illustrating the variation of the amplitude of the recovered clock signal with phase changes.
FIG. 11 is a circuit diagram of a first embodiment of a phase locked delay line with an associated control circuit.

The above described can also be illustrated by means of the vector diagram according to FIG. 10, where the magnitude of the arrow $u_{mix}$, which represents the signal resulting from the mixing of two signals, i.e. the output signal at 64, provides the amplitude of this signal for a certain phase shift φ between the signal at 64 and $CK_{in}$. As can be seen the amplitude has maximum at four occasions, i.e. when the 90°, 180°, 270° and 360° signals, respectively, are let through unmixed alone.

The implementation in practice of the logic control network 156, in order to be able to carry through that described above with reference to the state graph, is easily conceivable by the man of the art and need therefore not be described more closely here. Shortly there can be the question of a sequence circuit of a conventional implementation per se, e.g. built from MOS-transistors.

For each one of the inputs 160 and 164, and the outputs 168, 170, 172, 174, respectively, the switches 158 and 166 can be equipped with suitably connected transmission gates including MOS-transistors digitally controlled from the control network 156. The inputs 184 and 186 represented in FIG. 5 as each a single input, would then in practice correspond to two and four control inputs, respectively. Also here one skilled in the art would understand how to carry this through in practice.

The circuit 2 illustrated in FIG. 1 is the most simple form of a phase locked delay line for extracting a four-phase clock or, as shown in the Figure, a two-phase clock. The disadvantage of this construction is that it is sensitive to the pulse/pause relationship of the incoming clock $CK_{in}$ due to the fact that it does only have two delay elements and that both negative and positive edges of the incoming clock are used. If there are great demands for a small pulse/pause distortion in the following steps a more complicated solution must be used according to the following embodiments.

In FIG. 11 a phase locked delay line, generally designated 300, extracts an accurate four-phase clock from a reference clock.

This delay line consists of four delay elements 301, 302, 304 and 306, respectively, plus an extra one at each end, 308 and 310, respectively. The element 308 is intended for increasing the accuracy and the element 310 to provide a pulse phase shifted 360° with respect to the first pulse to a phase detector, generally designated 312, which will be described in more detail below. By using only positive edges from the delay line a four-phase clock is obtained, which is independent of the pulse/pause relationship of the incoming clock $CK_{in}$, and which thereby attains the greatest possible accuracy for the position of the positive edges with respect to each other.

The incoming clock is delayed 90° per delay stage 301–306. By gating together, by means of AND-gates 314–318, the different clock phases in pairs an accurate four-phase clock is obtained, the phases of which are designated A–D in FIG. 11. The last clock phase, designated E, from an AND-gate 320 at the stage 310 normally lies 360° after A. A and E are used by the phase detector 312 for generating a control signal dT-reference, which is needed for controlling the delay line. An extra clock phase C is needed for fulfilling the boundary conditions for obtaining that the phase detector 312 shall not land in an undefined condition at start.

By gating together the four-phase clocks A–D in pairs, by means of OR-gates 322 and 324 two clocks X and Y with the double frequency of the input clock $CK_{in}$ are obtained. The positive edge of these two signals has a high accuracy in its positions, the negative one can however deviate somewhat. Y is therefore not exactly the inverse of X. These two signals are made to clock a respective D-flip-flop 326 and 328, respectively, whereby a two-phase clock Ck0 and Ck90 is obtained, which has a high accuracy on both the negative and positive edges.

Figure 12:
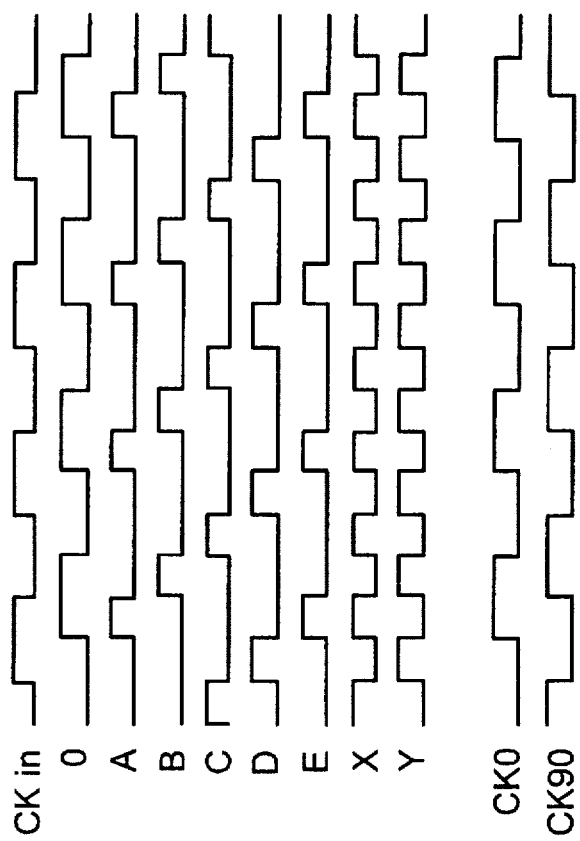
FIG. 12 is a diagram of signals appearing in the delay line according to FIG. 11.

FIG. 12 illustrates the mutual phase position of the above discussed signals.

Figure 13:
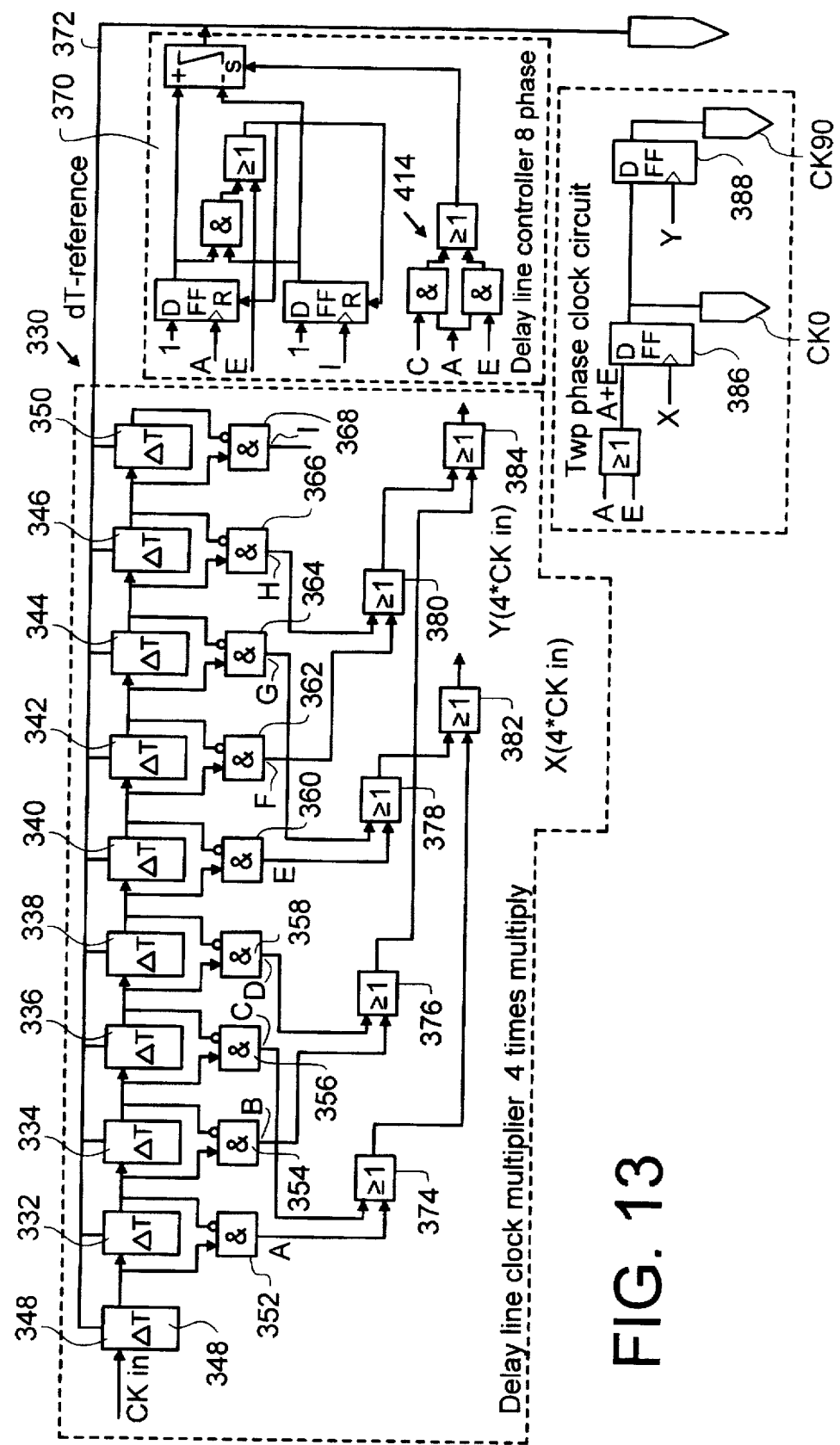
FIG. 13 is a circuit diagram of a second embodiment of phase locked delay line with an associated control circuit.

FIG. 13 illustrates a phase locked delay line, generally designated 330, which extracts an accurate phase clock from a reference clock $CK_{in}$. The essential construction of this delay line is the same as in the one in FIG. 11, but it is lengthened by four steps so as to provide an eight-phase clock. By this it is possible to halve the speed of the incoming reference clock $CK_{in}$ and yet get a four-phase clock with the same function as in the preceding solution.

More particularly, the delay line 330 contains eight delay elements 332, 334, 336, 338, 340, 342, 344, 346. An extra delay element 348 and 350, respectively, is arranged at each end, the first one to increase the accuracy and the last one for providing a pulse which is phase shifted 360° with respect to the first pulse in the phase detector, as in the embodiment according to FIG. 12. By using only positive edges from the delay line 330 an eight-phase clock is obtained, which is independent of the pulse/pause relationship of the incoming clock $CK_{in}$ and which in this way obtains the greatest possible accuracy for the position of the positive edges with respect to each other.

The incoming clock $CK_{in}$ is delayed 45° per delay step, corresponding with respect to time 90° with the fastest clock in the preceding embodiment. By gating together the different clock phases in pairs, by means of AND-gates 352, 354 ... 366 the accurate eight-phase clock is obtained, the phases of which are designated A–H in FIG. 13. The last clock phase I, from the AND-gate 368 normally lies 360° behind A. A and I are used by the phase-detector, generally designated 370, for generating a control signal dT-reference from the output 372, needed for controlling the delay line. Two extra clock phases C and E are needed for fulfilling the boundary conditions to attain that the phase detector shall not land in any undefined condition at start.

By gating together the four-phase clocks in pairs (by means of OR-gates 374, 376, 378, 380, 382, 384) two clocks X and Y are obtained having a frequency which is four times greater than that of the input clock $CK_{in}$. The positive edge of these two signals has a high accuracy in its positions, but the negative one can deviate somewhat, and thus Y is not exactly the inverse of X. These two signals are used for clocking each D-flip-flop 386 and 388, respectively, whereby a two-phase clock, Ck0 and Ck9 is obtained, which has a high accuracy both at the negative and at the positive edge.

Figure 14:
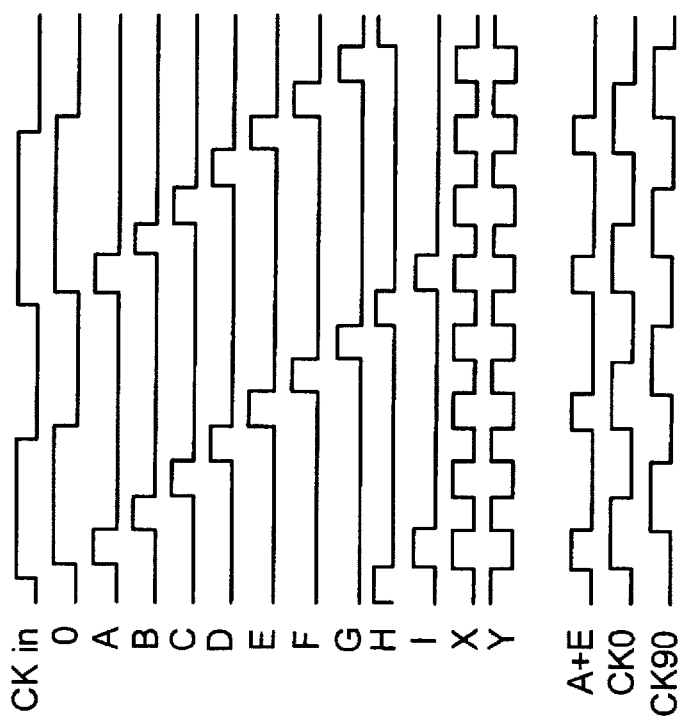
FIG. 14 is a diagram of signals appearing in the delay line according to FIG. 13.

In FIG. 14 the relative appearance and phase position of the above discussed signals are illustrated.

Figure 15:
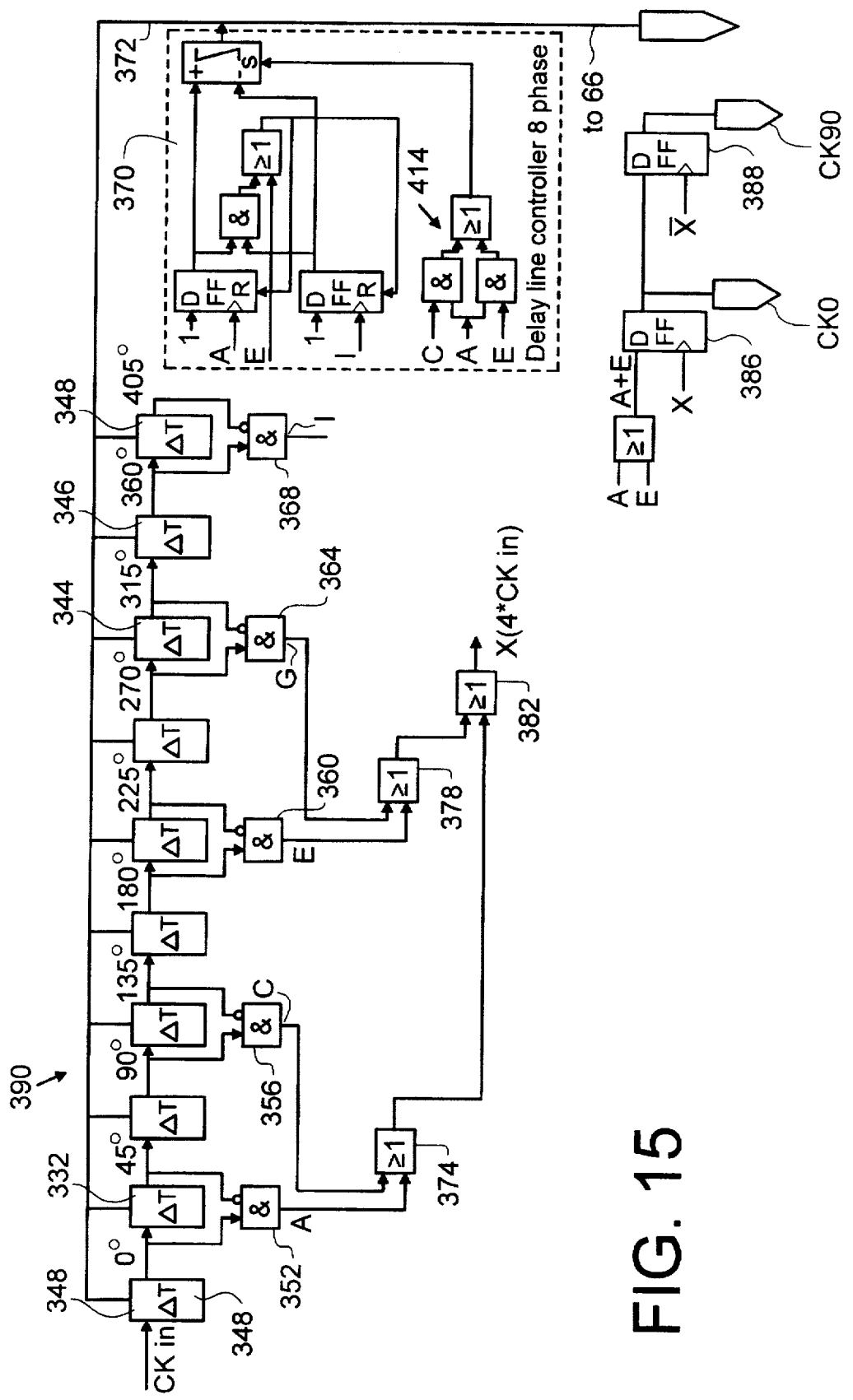
FIG. 15 is a circuit diagram of a third embodiment of a phase locked delay line with an associated control circuit.

FIG. 15 illustrates a phase locked delay line, generally designated 390, extracting an eight-phase clock from a reference clock $CK_{in}$. The constructions of this delay line is essentially the same as of the one in FIG. 13 although it is simplified in a way that only the inverted clock signal X is used as the Y-signal. The same references as in FIG. 13 have been used in FIG. 15 for elements with the same function. The embodiment according to FIG. 15 provides a simpler design, but has not the same accuracy with respect to the positive clock edges of the Y-signal due to the fact that these are the negative ones in the X-signal, although this can provide a sufficient accuracy in certain applications and by means of an optimized design.

Figure 16:
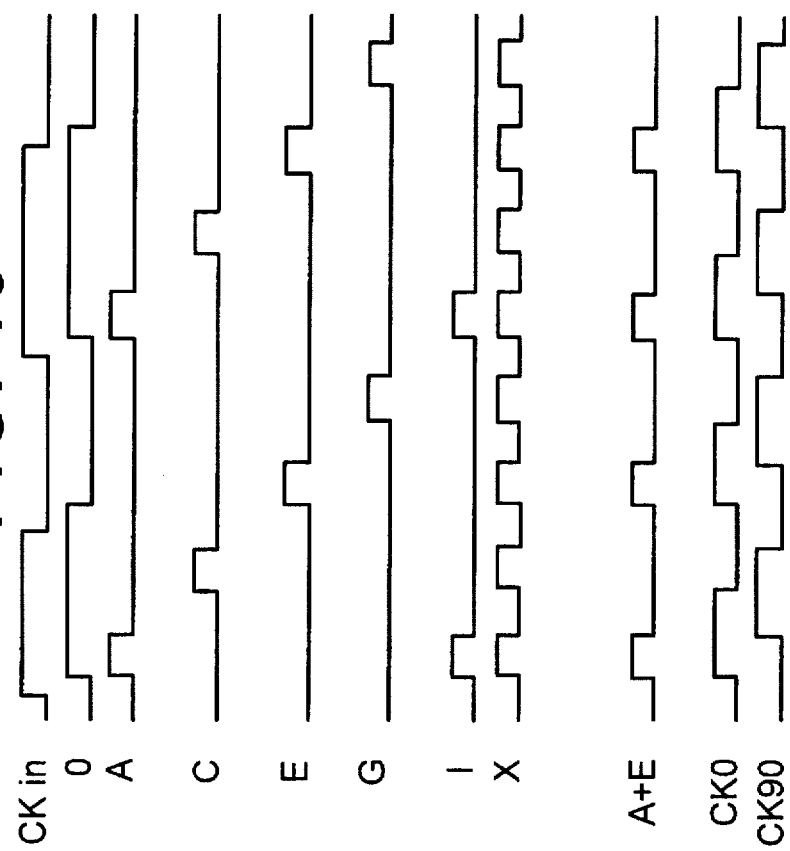
FIG. 16 is a diagram of signals appearing in the delay line in FIG. 15, FIGS. 17 and 18 are diagrams of signals appearing in the control circuits in FIGS. 11, 13 and 15, FIGS. 19a–19c are schematic block diagrams for illustrating the use of a clock multiplier according to the invention.

The appearance and phase of the pulses appearing in FIG. 15 is illustrated in FIG. 16.

To sum up, and more generally, the delay line circuits in FIGS. 11, 13 and 15 may be defined as comprising:

phase shifting means 301–310 and 332–350, respectively, for imparting to the reference clock successively increasing phase shift, with a number of outputs for such successively phase shifted signals, first combining means 314–320 and 352–368, respectively, for combining the phase shifted signals in groups for obtaining a number of pulses A–E and A–I, respectively, with a length corresponding to the phase shift between the outputs of the corresponding group and the same frequency as that of the reference signal, second combining means 322,324 and 374–384, respectively, for combining the pulses while maintaining the pulse length for obtaining a number of pulse signals X and X,Y, respectively, with a frequency consisting of a multiple of the reference clock, a clock signal generating circuit 326,328 and 386,388, respectively, for generating, from the pulse signals, the accurately mutually time delayed clock signals CK0 and CK90 in the form of a desired number of clock signals with a desired mutual phase shift.

The way of operation of the above-mentioned phase detectors 312 and 370 will now be described in more detail.

It is the question of two types of control circuits. The basic circuit is a three position phase detector modified with a number of different set signals for avoiding different false locking cases.

Figure 17:
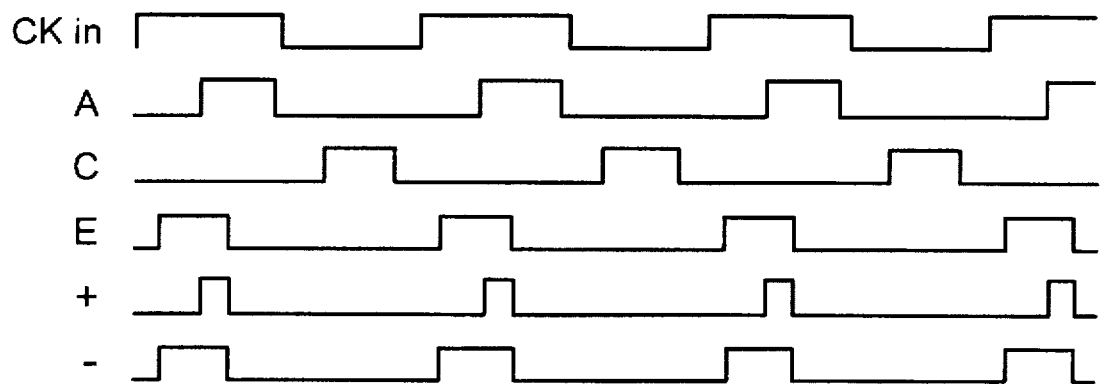
Figure 18:
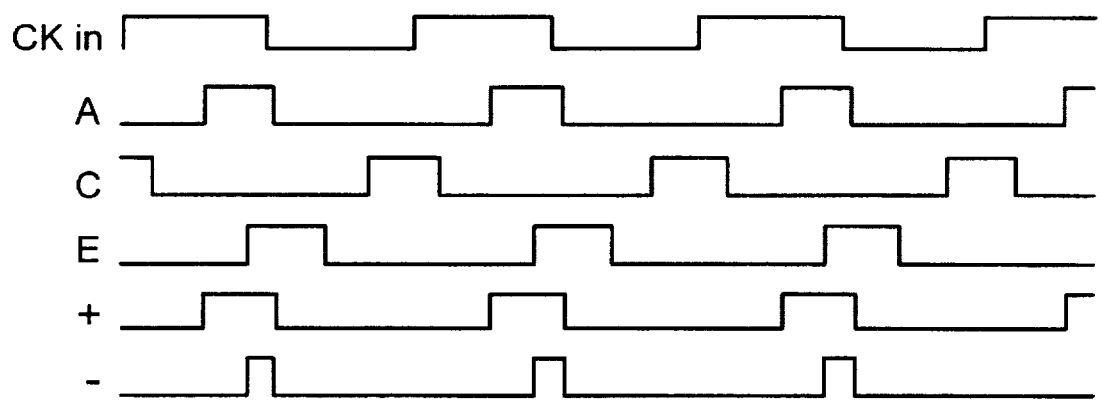

FIGS. 17 and 18 show how it looks like for the four-phase detector 312 around its point of operation, which shall be 360°. FIG. 17 shows a too short time delay. Since the signal C via an OR-gate 400 in FIG. 11 always provides a reset signal to two flip-flops, designated 402 and 404, respectively, in FIG. 11, there will always be a defined start position. The flip-flop 404 which is the first flip-flop to be set, is the one affected by E resulting in a —input 406 of the integrator 408 becoming a longer pulse than a +input 410, this in turn implying that the output current or output voltage dT-reference of the integrator decreases in order for the time delay in the delay elements 301–310 to increase. When the delay increases, the —pulse is shortened and comes at last equally short as the +pulse, which in turn shall be the correct point of operation of the integrator. If the delay time is too long, as illustrated by FIG. 18, the opposite reasoning is true, the +pulses being longer here resulting in an increased current or voltage dT-reference, this in turn resulting in a shorter delay time in the delay stages.

A similar reasoning is true with respect to the eight-phase detector.

The upper input C in the 4-phase detector 312, E in the eight-phase detector in FIG. 13, is therefore providing for the detector a correct sequence order in the flip-flops 402 and 404 when the delay is at minimum position, i.e. the current in the delay stages is at maximum and thereby the delay at minimum. The input signals A and C to an AND-gate 411 in the four-phase detector is therefor providing reset of the phase detector if the delay would happen to become 720°, i.e. double the normal delay. Reset is made by controlling the integrator 408 to provide maximum current or voltage and thereby minimum time delay by affecting a set input 412. If the total phase delay should be greater than 720° the signal E fades away and attains any fixed position. Thereby the integrator acts for decreasing the delay by the A-signal remaining longer than the E-signal.

In the eight-phase detector 370 in FIG. 13 gating together is made at 414 of the signals A and C or A and E, this preventing the phase detector 370 to lock erroneously on 720, 1080 and 1440 degrees. If the total phase delay would be greater than 1440 degrees, the signal I fades away and takes some fixed position. Thereby the integrator acts for decreasing the delay by the A-signal remaining longer than the I-signal.

The different clock multiplication embodiments described above with reference to FIGS. 11–18 illustrate how it is possible to generate a four-phase or eight-phase clock from a reference clock. If it is desirable in both cases to have one and the same speed of the output clock, the input clock in the eight-phase clock solution must have half the speed of the input clock of the four-phase clock solution, i.e. also a clock doubling is obtained with the eight-phase clock solution.

By e.g. lengthening the delay line with eight further steps so as to obtain a sixteen-phase clock, a clock multiplication by 8 is achieved. This implies that it is possible to use an input clock having only one fourth of the speed of the input clock to the four-phase clock solution. Also other multiplication factors than 4, 8 or 16 are conceivable. Multiplication is also possible by means of odd numbers.

It is also conceivable to connect together several separate clock multiplication solutions with each other with intermediate frequency dividers which have mutually different multiplication factors, whereby it is possible to obtain arbitrary clock frequencies in a similar way as obtained by means of PLL-solutions where it is possible to divide and multiply sequences simultaneously.

An example of that stated above is illustrated in FIG. 19.

Figure 19A:
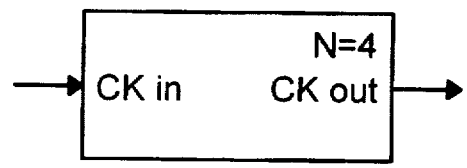

To begin, FIG. 19a symbolically represents as an example the delay line circuit according to FIG. 15 except for the step for generating the clocks CK0 and CK90, $CK_{in}$ being the input clock to the delay step 308 and $CK_{out}$ being the signal out from the gate 382. This multiplier has a multiplying factor 4.

Figure 19B:
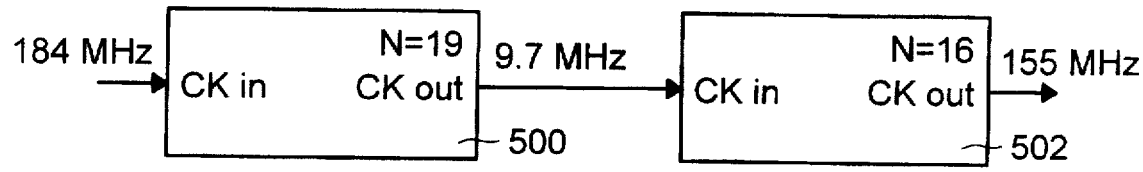
Figure 19C:
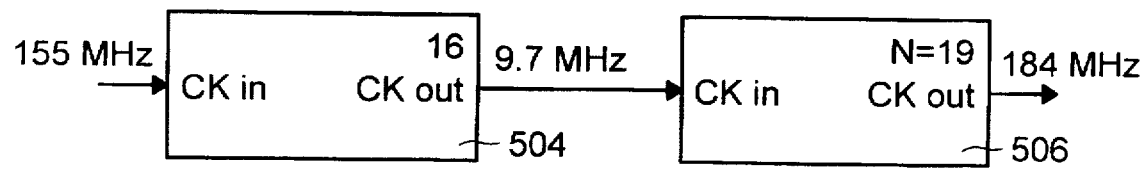

Clock multipliers with an arbitrary desired multiplication factor can be built according to this principle and used together with dividers for obtaining other frequencies which are not an integral multiple of the input frequency. Thus, FIG. 19b illustrates how it is possible to use a divider 500 with the dividing factor 19 and a multiplier 502 with a multiplication factor 16 to obtain e.g. the clock frequency 155 MHz from a 184 MHz clock. In FIG. 19c the opposite is obtained by means of a divider 504 with a dividing factor 16 and a multiplier 506 with a multiplying factor 19. The dividing relationship between 155 and 184 is 16/19. A division is conventionally very simple to obtain by means of a counter with a desired length.

The bounds are set by the quality of the incoming clock, the jitter of which with time being directly transferred without damping to the output clock. This implies that the relative jitter obtained in the output clock with respect to the input clock is multiplied with the clock multiplying factor.

In the applications used in a mux/demux-solution with a low speed clock these clock multiplying solutions can advantageously be used, either entirely or in parts thereof. For the mux circuit the multi phase clock obtained can be used for multiplying together the different data streams.

Figure 20:
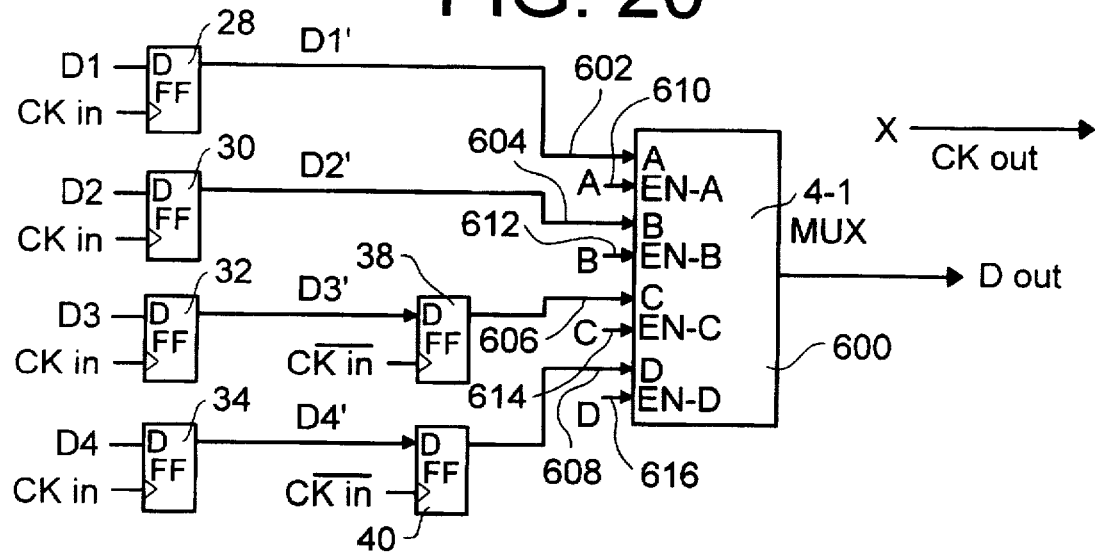
FIG. 20 is a schematic block diagram of an embodiment of a multiplexor circuit according to the invention.

A solution alternative to the multiplying circuit according to FIG. 1 is shown in FIG. 20. Here one can e.g. start from the delay line circuit according to FIG. 11, although the generation of clocks Y, CK0 and CK90 is omitted and instead the clocks A–D, X and $CK_{in}$ are used in the way shown in FIG. 20. In FIG. 20 the same reference characters have been used for the same or similarly acting elements as in FIG. 1.

More particularly, the outputs of the flip-flops 28–34 and the flip-flops 38–40 are connected for transmitting the aligned and delayed, respectively, data bits to data inputs 602–608 of a selector 600, which also has a number of control inputs 610–616 and a data output 618. The outputs from the AND-gates 314–318 are connected for transferring the clock phases A–D to the control inputs of the selector. Via the control inputs the clock phases A–D control the selector 600 so that one data input at a time is connected to the data output of the selector, the clock signal X, see also FIG. 11, forming the clock of the outgoing data stream.

Figure 21:
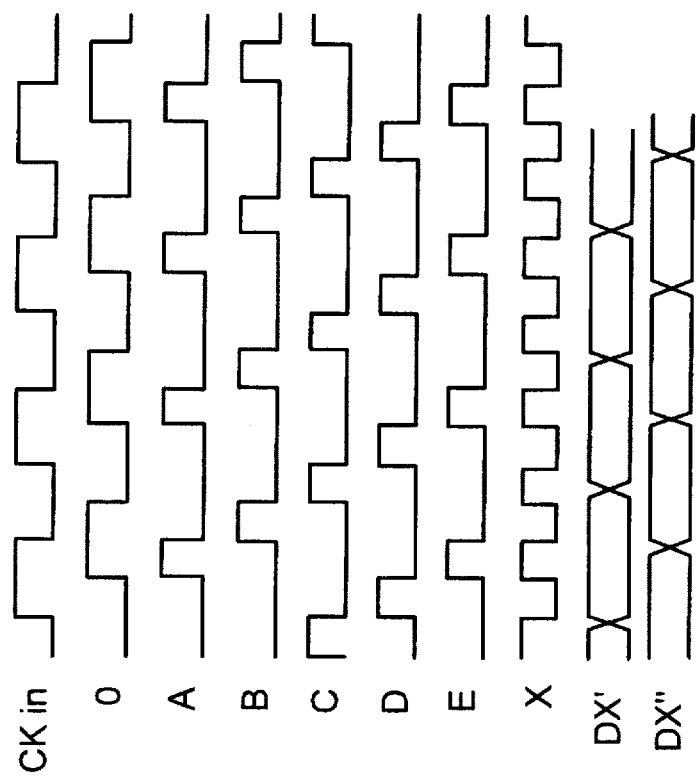
FIG. 21 illustrates diagrams of data signals appearing in the multiplexor circuit according to FIG. 20.

The aligning of data and delay is effected precisely as in FIG. 1, although the order is somewhat reversed. Referring to FIG. 21, D1'–D4', DX' in FIG. 21, designate the aligned data bits or data streams, and D3" and D4", DX" in FIG. 21, designate the delayed data bits.

Thus, in place of the simple delay circuit according to FIG. 1, the more refined variant with a four-phase clock has been chosen. The four clock phases A–D are made to directly control a simple multiplexor 600 or, more correctly, a four route selector. The four clock phases control the selector so that one data channel at a time is connected to the output.

For the demux circuit the composite two-phase clock, Ck0 and Ck90, respectively, can be used by the clock rotating circuit, simultaneously as the delay time reference, dTref, can be used for controlling the band width of the clock rotator 55 and the delays of the following delay line 66.

In order to refine the solution further, the second delay line 66 can be provided with its own control step for further decreasing any phase errors. It is also conceivable to change the clock multiplying factor for being able to use another input clock, which in turn may imply that the second delay line 66 must have its own control step.

The great advantage of the described technique is that it is possible to externally use a clock with a considerably lower rate than the rate needed internally in the circuit. Otherwise, what is used is different PLL-solutions for changing up to the highest rate needed. As a rule, the frequency becomes the double of that obtained in the preceding solution. In addition this implies, normally, greater solutions which take more space and draw more power.

What is claimed is:

1. A delay line circuit, comprising:

phase shifting means for imparting to a reference clock successively increasing phase shifts with a plurality of outputs for such successively phase shifted signals;

a plurality of first combining means for combining said phase shifted signals in groups for obtaining a number of pulses which have a pulse length corresponding to the phase shift between the outputs of each first combining means and a frequency equal to a frequency of said reference clock;

second combining means for combining the pulses for obtaining a number of pulse signals with a frequency which is a multiple of said reference clock frequency while maintaining the pulse length of said pulse signals;

a clock signal generating circuit for generating, from said pulse signals, time delayed clock signals in the form of a selected number of clock signals with a phase shift; and a control circuit, arranged to control the time delay of said delay line circuit which includes means for receiving at least two phase shifted signals from said outputs and determining a delay error, and to generate a control signal for said delay line circuit, the magnitude of which depends upon the delay error.

2. A circuit according to claim 1, wherein said phase shifted signals are combined in groups of two.

3. A circuit according to claim 1, wherein said phase shifting means consist of series connected delay stages, where the input and output of each delay stage are combined to obtain one of said pulses with a length corresponding to the phase shift of each corresponding delay stage.

4. A circuit according to claim 1, wherein said first combining means consist of AND-gates with an inverting input.

5. A circuit according to claim 1, wherein said second combining means consist of OR-gates.

6. A circuit according to claim 1, wherein said control circuit includes means for preventing said control circuit from falsely locking onto multiples of the period of said reference clock.

7. A clock multiplying circuit, comprising:

phase shifting means for imparting to a reference clock a successively increasing phase shift with a number of outputs for such successively phase shifted signals;

a plurality of first combining means for combining said phase shifted signals in groups for obtaining a number of pulses which have a pulse length corresponding to the phase shift between the outputs of each first combining means and a frequency equal to a frequency of said reference clock;

second combining means for combining said pulses to obtain a clock signal which has a frequency which is a multiple of said reference clock frequency while maintaining the pulse width of said clock signal; and a control circuit, arranged to control the time delay of said clock multiplying circuit which includes means for receiving at least two phase shifted signals from said outputs and determining a delay error, and to generate a control signal for said clock multiplying circuit, the magnitude of which depends upon the delay error.

8. A circuit according to claim 7, wherein said phase shifted signals are combined in groups of two.

9. A circuit according to claim 7, wherein said phase shifting means consist of series connected delay stages, where the input and output of each delay stage are combined to obtain one of said pulses with a length corresponding to the phase shift of each corresponding delay stage.

10. A circuit according to claim 7, wherein said first combining means consist of AND-gates with an inverting input.

11. A circuit according to claim 7, wherein said second combining means consist of OR-gates.

12. A circuit according to claim 7, wherein said control circuit includes means for preventing said control circuit from falsely locking onto multiples of the period of said reference clock.

* * * * *